(12) United States Patent
Williams

(10) Patent No.: US 8,649,146 B2
(45) Date of Patent: Feb. 11, 2014

(54) CAPACITANCE CHECK AND CURRENT MONITORING CIRCUIT FOR USE WITH A CIRCUIT PROTECTION DEVICE

(75) Inventor: Craig Benjamin Williams, Louisville, KY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/971,591

(22) Filed: Dec. 17, 2010

(65) Prior Publication Data

US 2012/0154957 A1    Jun. 21, 2012

(51) Int. Cl.
*H01H 73/00* (2006.01)
*H02H 3/00* (2006.01)
*H02B 1/24* (2006.01)

(52) U.S. Cl.
USPC .............................. 361/115; 361/71; 307/127

(58) Field of Classification Search
USPC .......................................... 361/115
See application file for complete search history.

(56) References Cited

U.S. PATENT DOCUMENTS

| | | | |
|---|---|---|---|
| 3,229,158 A | 1/1966 | Jensen | |
| 3,248,605 A | 4/1966 | Tomkinson | |
| 5,036,284 A | 7/1991 | Cichanski | |
| 5,068,640 A | 11/1991 | Burger et al. | |
| 6,240,534 B1 | 5/2001 | Nakane | |
| 6,377,431 B1 * | 4/2002 | Jones et al. | ...................... 361/96 |
| 6,576,922 B1 | 6/2003 | Ma et al. | |
| 7,411,374 B2 | 8/2008 | Tan et al. | |
| 7,667,353 B2 * | 2/2010 | Coolidge et al. | .............. 307/127 |
| 7,710,080 B2 | 5/2010 | Kobayashi et al. | |
| 2008/0010549 A1 * | 1/2008 | Coolidge et al. | ................ 714/44 |
| 2008/0169791 A1 | 7/2008 | Daio | |
| 2009/0027817 A1 | 1/2009 | Kamiyama et al. | |
| 2010/0194354 A1 | 8/2010 | Gotou et al. | |

OTHER PUBLICATIONS

Search Report and Written Opinion from corresponding EP Application No. 11191850 May 14, 2012.

* cited by examiner

*Primary Examiner* — Jared Fureman
*Assistant Examiner* — Lucy Thomas
(74) *Attorney, Agent, or Firm* — General Electric Company

(57) ABSTRACT

A circuit protection device includes a trip mechanism and at least one capacitor configured to store electrical energy and to provide the electrical energy to the trip mechanism. The circuit protection device also includes a controller communicatively coupled to the at least one capacitor and configured to measure a charge property of the at least one capacitor, compare the measured charge property to a threshold, and output a signal indicative of the comparison.

20 Claims, 6 Drawing Sheets

CAPACITANCE CHECK AND CURRENT MONITORING CIRCUIT FOR USE WITH A CIRCUIT PROTECTION DEVICE

BACKGROUND OF THE INVENTION

The embodiments described herein relate generally to a circuit protection device and, more particularly, to an apparatus for use in monitoring a charge status of a capacitor of a circuit protection device.

Known electric distribution circuits and switchgear generally have conductors that are separated by insulation, such as air, or gas or solid dielectrics. However, if the conductors are positioned too closely together, or if a voltage between the conductors exceeds the insulative properties of the insulation between the conductors, an arc can occur. For example, the insulation between the conductors can become ionized, which makes the insulation conductive and enables formation of an arc flash.

An arc flash includes a rapid release of energy due to a fault between two phase conductors, between a phase conductor and a neutral conductor, or between a phase conductor and a ground point. Arc flash temperatures can reach or exceed 20,000° C., which can vaporize the conductors and adjacent equipment. Moreover, an arc flash can release significant energy in the form of not only heat, but also intense light, pressure waves, and/or sound waves, sufficient to damage the conductors and adjacent equipment. However, the current level of a fault that generates an arc flash is generally less than the current level of a short circuit, such that a circuit breaker generally does not trip or may exhibit a delayed trip unless the circuit breaker is specifically designed to handle an arc fault condition.

At least some known circuit protection devices include one or more high voltage and high energy capacitors for use in initiating a secondary arc flash within an enclosure that is designed to safely contain the energy released by the secondary arc flash. These capacitors can be used to provide energy to an ablative plasma gun that releases plasma into a gap between a plurality of electrodes to facilitate formation of the secondary arc flash. Similarly, at least some known circuit protection devices include one or more high voltage and high energy capacitors for use in interrupting current flow through the circuit protection device by causing separation of conductive contact arms. At least some known capacitors experience failure or degradation in performance over time due to heat generated within the circuit protection device, for example. However, it is difficult to observe the charge status of these capacitors. Unracking these circuit protection devices while the capacitors are charged or are charging can lead to severe electrical shocks or burns if an operator were to come into contact with the capacitors. Accordingly, it is desirable to provide a means of monitoring and indicating the charge status of the capacitor and/or a means to alter the charge status of the capacitor.

BRIEF DESCRIPTION OF THE INVENTION

In one aspect, a circuit protection device includes a trip mechanism and at least one capacitor configured to store electrical energy and to provide the electrical energy to the trip mechanism. The circuit protection device also includes a controller communicatively coupled to the at least one capacitor and configured to measure a charge property of the at least one capacitor, compare the measured charge property to a threshold, and output a signal indicative of the comparison.

In another aspect, a test circuit is provided for use with a circuit protection device having a trip mechanism and at least one capacitor configured to store energy for use by the trip mechanism. The test circuit includes a current sensor and a processor communicatively coupled to the current sensor. The current sensor is configured to measure a current through the at least one capacitor. The processor is configured to compare the measured current to a threshold current, and output a signal indicative of the comparison.

In another aspect, a method is provided for monitoring operation of a capacitor for use in a circuit protection device. The method includes measuring a current through the capacitor, determining an operating status for the capacitor based on the measured current, and outputting a signal indicative of the operating status.

DETAILED DESCRIPTION OF THE INVENTION

Exemplary embodiments of systems, methods, and apparatus for use in monitoring capacitance of a capacitor within a circuit protection device are described herein. These embodiments facilitate monitoring whether a capacitor, or a bank of capacitors, has sufficient capacitance by monitoring current consumption by the capacitor. The measurement may be a single measurement, such as during an initial charge time, or may be a repetitive measurement, such as a periodic measurement. Enabling approximately continuous monitoring of current consumption by the capacitor facilitates detecting a failure of the capacitor or degradation of the capacitor before a subsequent reset of the circuit protection device. Moreover, the embodiments described herein facilitate monitoring current consumption of the capacitor and/or other circuit components during multiple operation modes. For example, a first operation mode of the circuit protection device may cause the capacitor to draw a first current level, and a second operation mode may cause the capacitor to draw a second current level. Comparing the first and second current levels to respective current profiles for each operation mode enables the circuit protection device to determine whether the capacitor, or any other circuit component, is functioning as desired.

Figure 1:
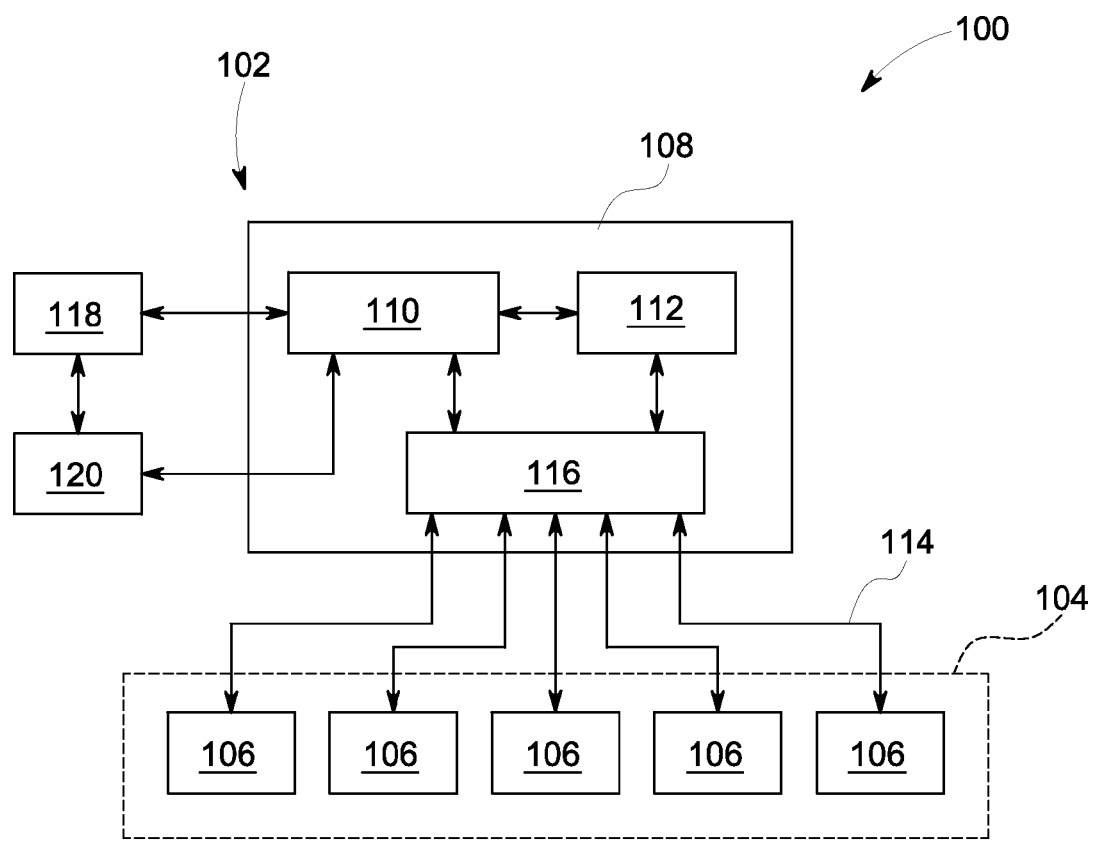
FIG. 1 is a schematic block diagram of an exemplary power system.

FIG. 1 is a schematic block diagram of an exemplary power system 100 that includes an equipment protection system 102 and a distribution system 104. In an exemplary embodiment, distribution system 104 includes a plurality of switchgear units 106. Protection system 102 includes a central controller 108 that includes a processor 110 and a memory area 112 coupled to processor 110. Processor 110 controls and/or monitors operation of switchgear units 106. More specifically, processor 110 controls and/or monitors operation of a plurality of circuit breakers and trip units (neither shown in FIG. 1) within switchgear units 106. Processor 110 communicates with switchgear units 106 via a network 114. For example, central controller 108 includes a central communication unit 116 that enables transmitting and receiving data and/or commands between processor 110 and switchgear units 106 via network 114.

It should be understood that the term "processor" refers generally to any programmable system including systems and microcontrollers, reduced instruction set circuits (RISC), application specific integrated circuits (ASIC), programmable logic circuits, and any other circuit or processor capable of executing the functions described herein. The above examples are exemplary only, and thus are not intended to limit in any way the definition and/or meaning of the term "processor."

Moreover, memory area 112 stores program code and instructions, executable by processor 110, to control and/or monitor switchgear units 106. Memory area 112 may include one, or more than one, forms of memory. For example, memory area 112 can include random access memory (RAM), which can include non-volatile RAM (NVRAM), magnetic RAM (MRAM), ferroelectric RAM (FeRAM) and other forms of memory. Memory area 112 may also include read only memory (ROM), flash memory and/or Electrically Erasable Programmable Read Only Memory (EEPROM). Any other suitable magnetic, optical and/or semiconductor memory, by itself or in combination with other forms of memory, may be included in memory area 112. Memory area 112 may also be, or include, a detachable or removable memory, including, but not limited to, a suitable cartridge, disk, CD ROM, DVD or USB memory.

Moreover, in an exemplary embodiment of FIG. 1, protection system 102 includes a display device 118 and a user input device 120 that provide a user interface for monitoring and controlling distribution system 104 using protection system 102. Display device 118 may include, without limitation, a monitor, a television display, a plasma display, a liquid crystal display (LCD), a display based on light emitting diodes (LED), a display based on a plurality of organic light-emitting diodes (OLEDs), a display based on polymer light-emitting diodes (PLEDs), a display based on a plurality of surface-conduction electron-emitters (SEDs), a display including a projected and/or reflected image or any other suitable electronic device or display mechanism. In one embodiment, display device 118 includes a touch-screen with an associated touch-screen controller. Display device 118 may be of any suitable configuration, such as a square, a rectangle or an elongated rectangle.

Figure 2:
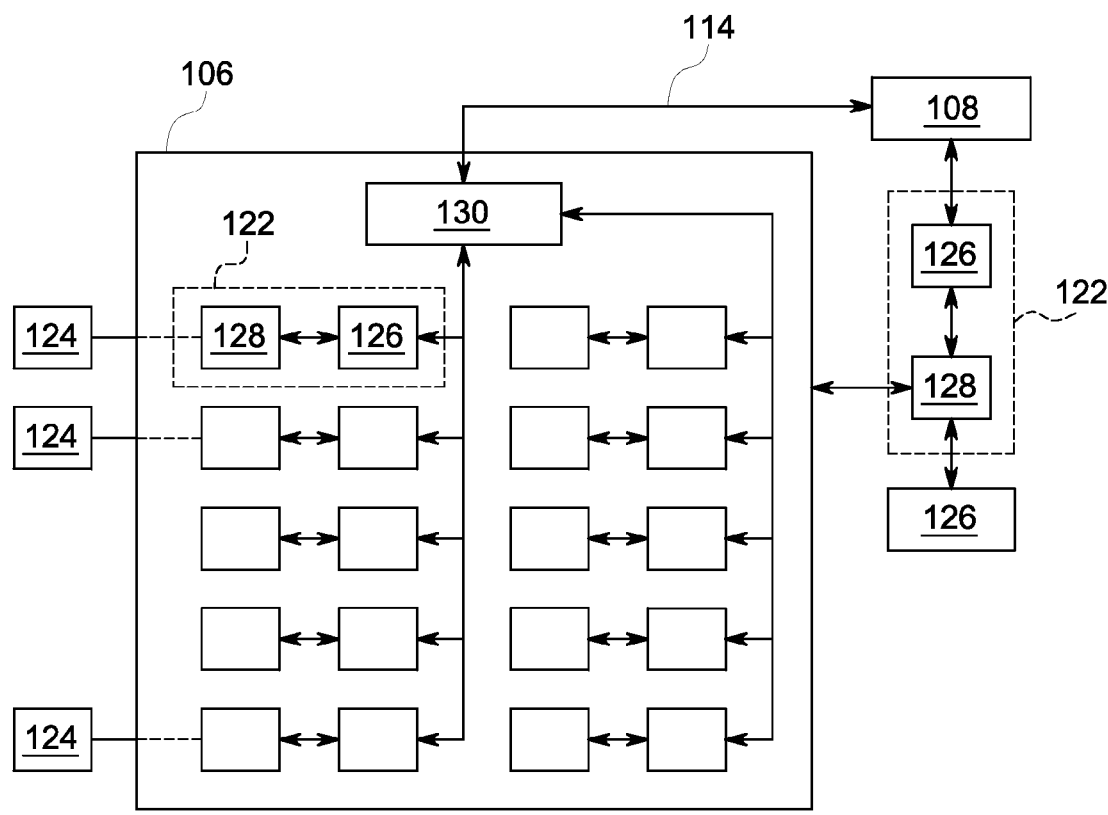
FIG. 2 is a schematic block diagram of an exemplary power distribution system that may be used with the power system shown in FIG. 1.

FIG. 2 is a schematic block diagram of power distribution system 104. In an exemplary embodiment, switchgear unit 106 also includes a plurality of circuit protection devices 122. Each circuit protection device 122 is removably coupled within switchgear unit 106 and is configured to control power to one or more loads 124. Loads 124 may include, but are not limited to only including, machinery, motors, lighting, and/or other electrical and mechanical equipment of a manufacturing or power generation or distribution facility. Power is provided to switchgear unit 106 from a main power feed 126, which is also coupled to circuit protection device 122. The power is then divided into a plurality of branch circuits using circuit protection devices 122 for providing power to loads 124.

Each circuit protection device 122 includes a controller 126 and a trip mechanism 128, such as circuit breakers or arc containment devices. Exemplary circuit breakers include, for example, circuit switches and/or circuit interrupters that interrupt current flow through the circuit breaker. An exemplary arc containment device includes, for example, a containment assembly, a plurality of electrodes, a plasma gun, and a trigger circuit that causes the plasma gun to emit ablative plasma into a gap between the electrodes in order to divert energy into the containment assembly from an arc of other electrical fault that is detected on the circuit. In an exemplary embodiment, controllers 126 are also communicatively coupled to central controller 108. For example, controllers 126 may be directly coupled for communication with central controller 108, or may be coupled for communication with central controller 108 via a communication unit 130. Moreover, communication between controllers 126 and central controller 108 may be provided via a hardwired communication link or via a wireless communication link. Controllers 126 collect operation data relating to a corresponding trip mechanism 128. For example, controller 126 may gather operation data by obtaining a current level through a conductor of a circuit that is monitored by circuit protection device 124, a voltage level across a plurality of conductors of the circuit that is monitored by circuit protection device 124, and/or a breaker status of circuit protection device 124. In some embodiments, controller 126 periodically receives the operation data at a preselected frequency. Moreover, controller 126 detects a fault on a circuit, such as a short circuit, an arc, or an overcurrent, and causes trip mechanism 128 to trip or to divert energy of the fault to protect the circuit and/or load 124.

Figure 3:
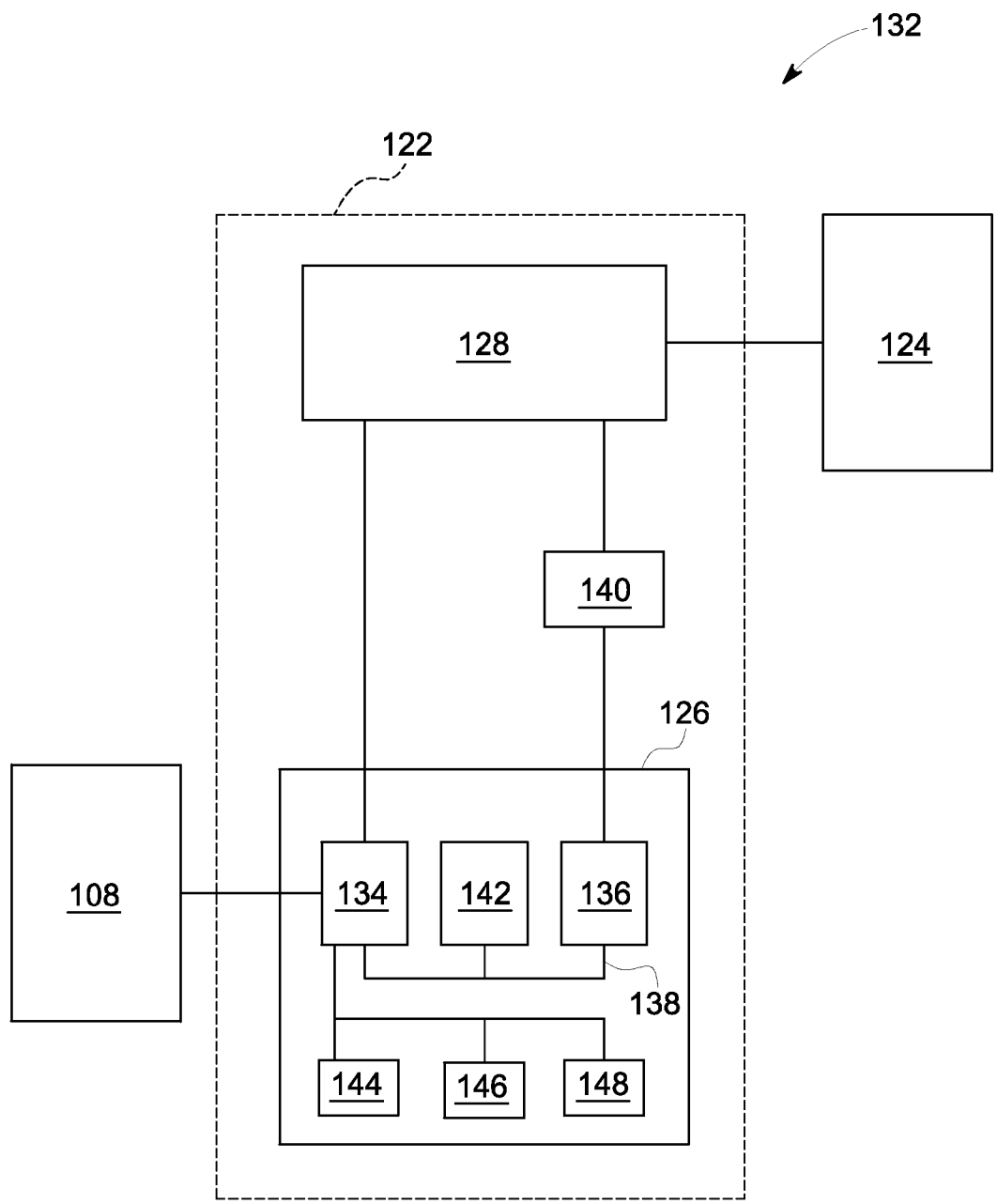
FIG. 3 is a schematic block diagram of an exemplary electrical architecture that may be used with the circuit protection device shown in FIG. 2.

FIG. 3 is a schematic block diagram of an exemplary electrical architecture 132 that may be used with circuit protection device 122. In an exemplary embodiment, controller 126 includes a processor 134 and a memory area 136 interconnected via a communications bus 138. In an alternative embodiment, each controller 126 includes multiple processors 134. Moreover, in another alternative embodiment, each controller 126 includes a plurality of memory areas 136. Processor 134 may be any programmable system including systems and microcontrollers, reduced instruction set circuits (RISC), application specific integrated circuits (ASIC), programmable logic circuits, or any other circuit or processor capable of executing the functions described herein. Memory area 136 stores operation data for controller 126 and/or trip mechanism 128. Memory area 136 may include one, or more than one, forms of memory. For example, memory area 136 can include random access memory (RAM), which can include non-volatile RAM (NVRAM), magnetic RAM (MRAM), ferroelectric RAM (FeRAM) and other forms of memory. Memory area 136 may also include read only memory (ROM), flash memory and/or Electrically Erasable Programmable Read Only Memory (EEPROM). Any other suitable magnetic, optical and/or semiconductor memory, by itself or in combination with other forms of memory, may be included in memory area 136. Memory area 136 may also be, or include, a detachable or removable memory, including, but not limited to, a suitable cartridge, disk, CD ROM, DVD or USB memory.

Moreover, in an exemplary embodiment, circuit protection device 122 includes one or more capacitors 140. In some embodiments, capacitor 140 may also be referred to herein as an activation capacitor, and is used to provide power to the plasma gun (not shown) of circuit protection device 122 for use in creating an arc within the arc containment device (not shown). Alternatively, capacitor 140 may be used as an activation capacitor and to provide power to trip mechanism 128. Moreover, in some embodiments, capacitor 140 may also be referred to herein as a pulse capacitor, and is used to provide a pulse signal to the plasma gun after the power is provided to the plasma gun. The pulse signal causes the plasma gun to create an arc plume within the arc containment device.

In an exemplary embodiment, controller 126 includes a test circuit 142 communicatively coupled to capacitor 140 for use in monitoring the charge status of capacitor 140. Test circuit 142 measures a charge property of capacitor 138, compares the measured charge property to a threshold, and outputs a signal indicative of the comparison. For example, test circuit 142 compares the measured charge property to a first threshold and outputs a first signal when the measured charge property is greater than the first threshold. Moreover, test circuit 142 compares the measured charge property to a second threshold and outputs a second signal when the measured charge property is less than the second threshold. Specifically, test circuit 142 measures a current through capacitor 140, compares the measured current to a first threshold current, and outputs the first signal when the measured current is greater than the first threshold current. Moreover, test circuit 142 compares the measured current to a second threshold current and outputs a second signal when the measured current is less than the second threshold current. In addition, test circuit 142 calculates a capacitance of capacitor 140 based on the measured current. Test circuit 142 compares the calculated capacitance to a threshold capacitance and outputs a signal if the calculated capacitance is not equal to or greater than the threshold capacitance within a preselected time period. In some embodiments, test circuit 142 includes processor 134. Alternatively, test circuit 142 communicates with processor 134 via communications bus 138.

Furthermore, in some embodiments, controller 126 includes at least one output device that indicates to an operator a charge status of capacitor 140. For example, in one embodiment, controller 126 includes a first output device 144, a second output device 146, and a third output device 148. First output device 144 indicates to an operator that capacitor 140 is sufficiently charged to drive operation of trip mechanism 128 within a desired time period. Second output device 146 indicates to the operator that capacitor 140 is discharged or failed to charge within a desired time. Third output device 148 indicates to the operator that capacitor 140 is charging.

Figure 4:
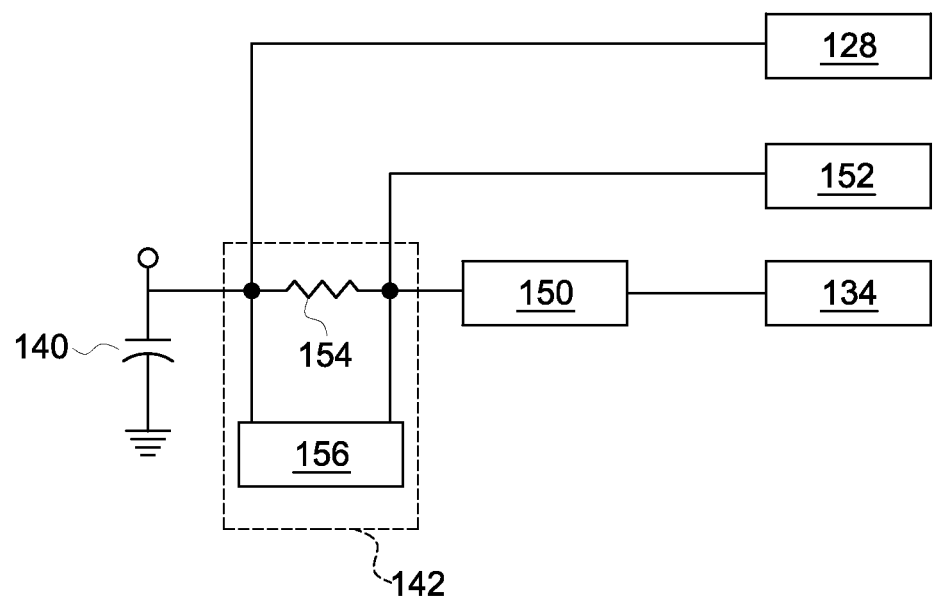
FIG. 4 is a schematic circuit diagram of the circuit protection device shown in FIG. 2.
Figure 5:
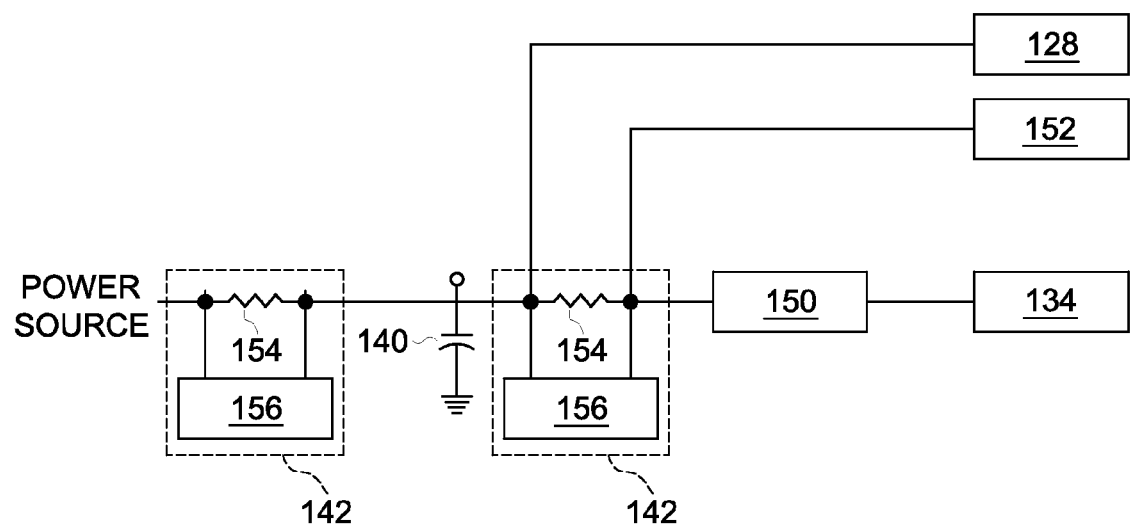
FIG. 5 is a schematic circuit diagram of an alternative embodiment of the circuit protection device shown in FIG. 2.

FIG. 4 is a schematic circuit diagram of circuit protection device 122, and FIG. 5 is an alternative embodiment of circuit protection device 122. In an exemplary embodiment, and as shown in FIG. 4, a power supply 150 is coupled to capacitor 140 and processor 134. Power supply 150 receives an input voltage for use by circuit protection device 122 and converts the input voltage to a low-voltage that is suitable for use with processor 134. Circuit protection device 122 also includes analog circuit components 152 such as light sensors, current sensors, voltage sensors, and the like. In an exemplary embodiment, test circuit 142 includes a resistive element 154, such as a resistor, and a current sensor 156. Current sensor 156 measures a current flowing through capacitor 140. In alternative embodiments, test circuit 142 may include any suitable sensing devices in addition to or instead of resistive element 154 and current sensor 156. For example, test circuit 142 may include a Hall sensor (not shown). Processor 134 compares the measured current to a threshold current and outputs a signal indicative of the comparison to one of output devices 144, 146, and 148 (shown in FIG. 3). More specifically, processor 134 compares the measured current to a first threshold current and outputs a first signal to first output device 144 when the measured current is greater than the first threshold current. Moreover, processor 134 compares the measured current to a second threshold current and outputs a second signal to second output device 146 when the measured current is less than the second threshold current.

In one embodiment, and as shown in FIG. 5, circuit protection device 122 includes multiple test circuits 142, including a first test circuit 142 that measures a first current into capacitor 140 and a second test circuit 142 that measures a second current into power supply 150. Processor 134 determines the current through capacitor 140 by subtracting the second current from the first current. Similarly, multiple trigger circuits 142 can be included to determine information about the health of electronics components within circuit protection device 122, such as power supply 150 and/or output devices 144, 146, and 148.

Furthermore, in one embodiment, processor 134 detects a circuit abnormality or failure when the measured current through capacitor 140, for example, is greater than approximately zero. In such an embodiment, the current through capacitor 140 is expected to be near zero except during a power-up operation of circuit protection device 122 or when circuit protection device 122 detects a fault within a monitored circuit. Thus, when processor 134 detects a current, such as a leakage current, through capacitor 140, for example, processor 134 can output a warning or error signal using one or more of output device 144, 146, and 148.

In an exemplary embodiment, processor 134 also measures the current during different operating modes of controller 126 and/or circuit protection device 122. For example, current sensor 156 measures a first current through capacitor 140 during a first operating mode and measures a second current through capacitor 140 during a second operating mode. Processor 134 causes controller 126 or circuit protection device 122 to switch between the first operating mode and the second operating mode between measurements by current sensor 140. Moreover, processor 134 performs a first comparison between the first current and a first threshold current and outputs a first signal based on the first comparison. Processor 134 also performs a second comparison between the second current and a second threshold current and outputs a second signal based on the second comparison.

In some embodiments, test circuit 142 is also used to monitor performance in the different operating modes for other electrical components of circuit protection device 122. For example, processor 134 can cause an analog circuit component 152 to switch between different operating modes. In such an embodiment, the current measured by current sensor 156 is indicative of the operation mode of the selected analog circuit component 152. Processor 134 determines whether the selected analog circuit component 156 is operating as desired by comparing the measured currents to threshold currents that are approximately known based on the selected operating modes.

Figure 6:
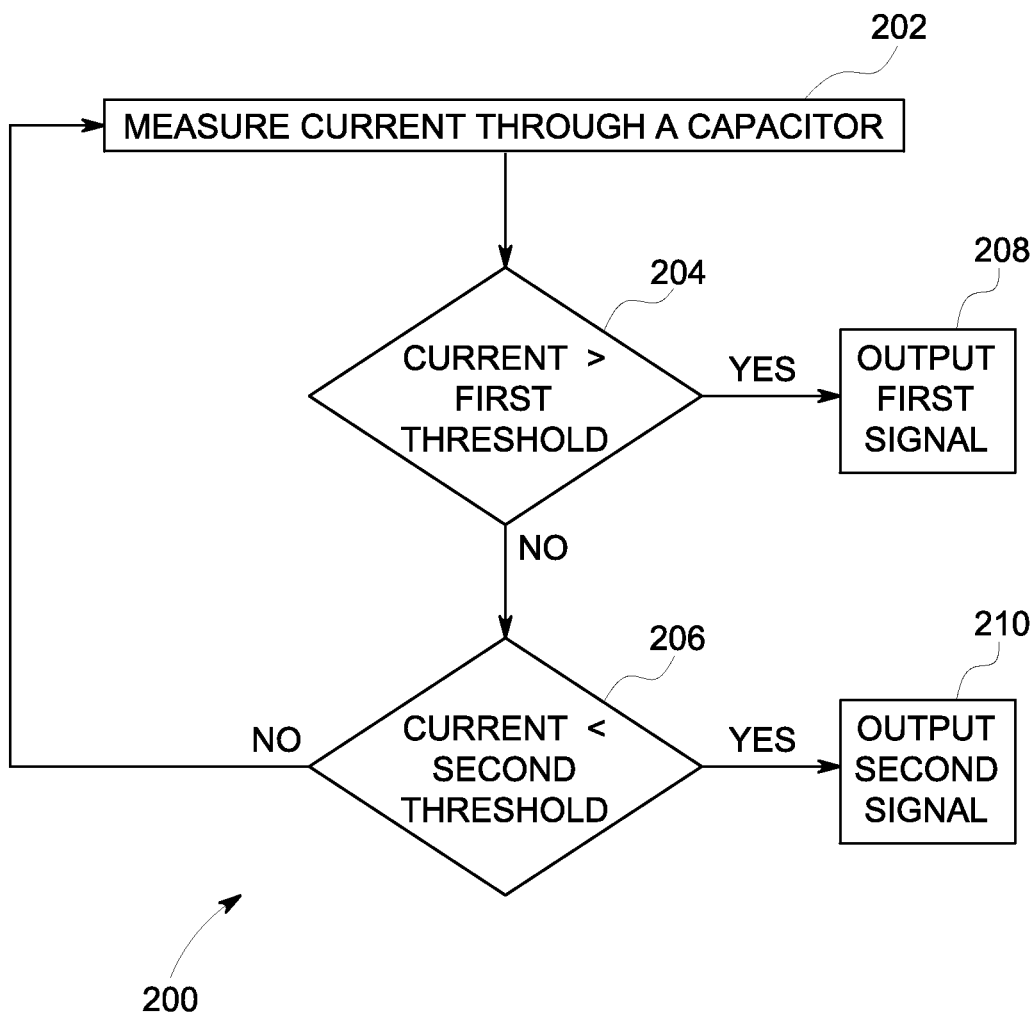
FIG. 6 is a flowchart that illustrates an exemplary method for using a test circuit to monitor operation of a capacitor of the circuit protection device shown in FIG. 2.

FIG. 6 is a flowchart 200 that illustrates an exemplary method for monitoring operation of capacitor 140 using test circuit 142 (both shown in FIGS. 3-5). In an exemplary embodiment, current sensor 156 (shown in FIGS. 4 and 5) measures 202 a current through capacitor 140, and transmits a signal indicative of the measured current to processor 134 (shown in FIGS. 4 and 5). Processor 134 determines an operating status for capacitor 140 based on the measured current. For example, processor 134 determines 204 whether the measured current is greater than a first threshold current and determines 206 whether the measured current is less than a second threshold current. Processor 134 also outputs a signal indicative of the operating status of capacitor 140. For example, processor 134 outputs 208 a first signal to first output device 144 (shown in FIG. 3) when the measured current is greater than the first threshold current and outputs a second signal to second output device 146 (shown in FIG. 3) when the measured current is less than the second threshold current. In an alternative embodiment, circuit protection device 122 includes multiple test circuits 142, including a first test circuit 142 that measures a first current into capacitor 140 and a second test circuit 142 that measures a second current into power supply 150 (shown in FIGS. 4 and 5). Processor 134 determines the current through capacitor 140 by subtracting the second current from the first current. Similarly, multiple trigger circuits 142 can be included to determine information about the health of electronics components within circuit protection device 122, such as power supply 150 and/or output devices 144, 146, and 148.

In some embodiments, current sensor 156 measures the first current through capacitor 140 during a first operating mode of circuit protection device 122, and measures the second current through capacitor 140 during a second operating mode of circuit protection device 122. In such an embodiment, processor 134 performs a first comparison between the first current and a first threshold current and outputs a first signal to first output device 144 based on the first comparison. Processor 134 causes circuit protection device 122 to switch from the first operating mode to the second operating mode, performs a second comparison between the second current and a second threshold current, and outputs a second signal to second output device 146 based on the second comparison.

Exemplary embodiments of systems, methods, and apparatus for monitoring a capacitance level of a circuit protection device power supply are described above in detail. The systems, methods, and apparatus are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

Although the present invention is described in connection with an exemplary circuit protection system, embodiments of the invention are operational with numerous other general purpose or special purpose circuit protection systems or configurations. The circuit protection system described herein is not intended to suggest any limitation as to the scope of use or functionality of any aspect of the invention. Moreover, the circuit protection system described herein should not be interpreted as having any dependency or requirement relating to any one or combination of components illustrated in the exemplary operating environment.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A circuit protection device comprising:
a trip mechanism;
a capacitor configured to store electrical energy and to provide the electrical energy to said trip mechanism;
a first current sensor configured to measure a first current;
a second current sensor configured to measure a second current; and
a controller communicatively coupled to said first current sensor and said second current sensor and configured to:
determine a current through said capacitor based at least in part on the measured first current and the measured second current;
compare the determined current to a first threshold; and
output a first signal indicative of the comparison.

2. A circuit protection device in accordance with claim 1, wherein said controller is further configured to:
output the first signal when the determined current is greater than the first threshold;
compare the determined current to a second threshold; and
output a second signal when the determined current is less than the second threshold.

3. A circuit protection device in accordance with claim 1, wherein said controller is further configured to calculate a capacitance of said capacitor.

4. A circuit protection device in accordance with claim 3, wherein said controller is further configured to compare the calculated capacitance to a threshold capacitance.

5. A circuit protection device in accordance with claim 4, wherein said controller is further configured to output a signal if the calculated capacitance is not equal to or greater than the threshold capacitance within a preselected time period.

6. A circuit protection device in accordance with claim 1, further comprising at least one output device communicatively coupled to said controller, said at least one output device configured to receive the signal from said controller and to indicate an operating status of said circuit protection device based on the signal.

7. A circuit protection device in accordance with claim 1 further comprising a power supply, and wherein said controller is further configured to determine a status of said power supply based at least in part on the measured first current and the measured second current.

8. A test circuit for use with a circuit protection device having a trip mechanism, said test circuit comprising:
a first current sensor configured to measure a first current;
a second current sensor configured to measure a second current; and
a processor communicatively coupled to said first current sensor and said second current sensor and configured to:
determine a current through at least one capacitor configured to store energy for use by the trip mechanism, the current determined based at least in part on the measured first current and the measured second current;
compare the determined current to a first threshold current; and output a first signal indicative of the comparison of the determined current to the first threshold current.

9. A test circuit in accordance with claim 8, wherein said processor is further configured to:
output the first signal when the determined current is greater than the first threshold current;
compare the measured current to a second threshold current; and
output a second signal when the measured current is less than the second threshold current.

10. A test circuit in accordance with claim 8, wherein said processor is further configured to calculate a capacitance of the at least one capacitor.

11. A test circuit in accordance with claim 10, wherein said processor is further configured to compare the calculated capacitance to a threshold capacitance.

12. A test circuit in accordance with claim 11, wherein said processor is further configured to output a signal if the calculated capacitance is not equal to or greater than the threshold capacitance within a preselected time period.

13. A test circuit in accordance with claim 8, wherein:
the determined current comprises a first determined current through the at least one capacitor during a first operating mode and a second determined current through the at least one capacitor during a second operating mode; and
said processor is further configured to:
compare the determined current to the first threshold current by comparing the first determined current and the first threshold current;
compare the second determined current and a second threshold current; and
output a second signal based on the comparison of the second determined current and the second threshold current.

14. A test circuit in accordance with claim 12, wherein said processor is further configured to cause the circuit protection device to switch between the first operating mode and the second operating mode.

15. A test circuit in accordance with claim 8, wherein said processor is further configured to determine a health status of at least one electronic component of the trip mechanism based at least in part on the measured first current and the measured second current.

16. A method for monitoring a circuit protection device, said method comprising:
measuring a first current and a second current;
determining a current through a capacitor coupled to provide power to a trip mechanism in the circuit protection device based at least in part on the measured first current and the measured second current;
determining an operating status for the capacitor based on the determined current; and
outputting a signal indicative of the operating status.

17. A method in accordance with claim 16, wherein determining an operating status comprises:
comparing the determined current to a first threshold current; and
comparing the determined current to a second threshold current.

18. A method in accordance with claim 17, wherein outputting a signal comprises:
outputting a first signal when the determined current is greater than the first threshold current; and
outputting a second signal when the determined current is less than the second threshold current.

19. A method in accordance with claim 16, wherein determining a current comprises:
determining a first current through the capacitor during a first operating mode of the circuit protection device; and
determining a second current through the capacitor during a second operating mode of the circuit protection device.

20. A method in accordance with claim 19, wherein determining an operating status comprises:
performing a first comparison between the determined first current through the capacitor and a first threshold current;
outputting a first signal based on the first comparison;
switching the circuit protection device from the first operating mode to the second operating mode;
performing a second comparison between the determined second current through the capacitor and a second threshold current; and
outputting a second signal based on the second comparison.

* * * * *

UNITED STATES PATENT AND TRADEMARK OFFICE
CERTIFICATE OF CORRECTION

| | |
|---|---|
| PATENT NO. | : 8,649,146 B2 |
| APPLICATION NO. | : 12/971591 |
| DATED | : February 11, 2014 |
| INVENTOR(S) | : Williams |

Page 1 of 1

It is certified that error appears in the above-identified patent and that said Letters Patent is hereby corrected as shown below:

In the Specification

In Column 6, Lines 33-34, delete "current sensor 140." and insert -- current sensor 156. --, therefor.

In Column 6, Line 48, delete "component 156" and insert -- component 152 --, therefor.

Signed and Sealed this
Twenty-seventh Day of May, 2014

Michelle K. Lee
*Deputy Director of the United States Patent and Trademark Office*